United States Patent
Yu et al.

(10) Patent No.: US 9,069,037 B2
(45) Date of Patent: Jun. 30, 2015

(54) METHODS FOR TESTING WIRELESS ELECTRONIC DEVICES USING AUTOMATIC SELF-TEST MODE

(75) Inventors: Qishan Yu, San Diego, CA (US); Jeffrey M. Thoma, Cupertino, CA (US); Robert S. Sorensen, Fremont, CA (US)

(73) Assignee: Apple Inc., Cupertino, CA (US)

( * ) Notice: Subject to any disclaimer, the term of this patent is extended or adjusted under 35 U.S.C. 154(b) by 623 days.

(21) Appl. No.: 13/359,292

(22) Filed: Jan. 26, 2012

(65) Prior Publication Data

US 2013/0197850 A1    Aug. 1, 2013

(51) Int. Cl.
*G01R 31/28* (2006.01)
*H04M 1/24* (2006.01)

(52) U.S. Cl.
CPC ........ *G01R 31/2822* (2013.01); *G01R 31/2843* (2013.01); *H04M 1/24* (2013.01)

(58) Field of Classification Search
CPC . G01R 31/001; G01R 31/002; G01R 29/0821
USPC ............. 702/117, 57, 60, 62, 81, 84–85, 106, 702/108, 120, 127, 182–183, 189; 455/11.1, 67.11–67.13, 115.1, 115.3, 455/226.1–226.2; 343/702–703; 324/537, 324/750.1, 750.14, 750.16, 750.18, 750.22, 324/750.26–750.27
See application file for complete search history.

(56) References Cited

U.S. PATENT DOCUMENTS

| | | | |
|---|---|---|---|
| 6,512,988 | B1 | 1/2003 | Kanago |
| 6,525,657 | B1 | 2/2003 | Wojcik |
| 6,943,561 | B2 | 9/2005 | Verspecht |
| 7,809,369 | B2 | 10/2010 | Parmar et al. |
| 8,054,221 | B1 | 11/2011 | Luong et al. |
| 8,588,763 | B2 * | 11/2013 | Venkataraman ............... 455/423 |
| 2006/0128373 | A1 | 6/2006 | Cochrane et al. |
| 2013/0122842 | A1 * | 5/2013 | Elfstrom .................... 455/226.3 |

OTHER PUBLICATIONS

Mujtaba et al., U.S. Appl. No. 13/099,204, filed May 2, 2011.
Posner et al., U.S. Appl. No. 13/348,496, filed Jan. 11, 2012.

* cited by examiner

*Primary Examiner* — Toan Le
(74) *Attorney, Agent, or Firm* — Treyz Law Group; Jason Tsai; Joseph F. Guihan

(57) ABSTRACT

A device under test (DUT) may be tested using a radio-frequency test station. The DUT may include at least one antenna, wireless communications circuitry associated with the antenna, and other peripheral components such as a camera module, a display module, and audio circuitry. The test station may include a shielded enclosure in which the DUT is placed during testing. The DUT need not be electrically wired to any test equipment. The DUT may be configured to operate in self test mode. The DUT may be configured to obtain baseline noise floor measurements while all the peripheral components are deactivated and may be configured to obtain elevated noise floor measurements while selectively activating desired subsets of the peripheral components. The difference between the elevated and baseline noise floor measurements may be computed to determine whether at least some of the peripheral components negatively impact the antenna performance by an excessive amount.

18 Claims, 7 Drawing Sheets

METHODS FOR TESTING WIRELESS ELECTRONIC DEVICES USING AUTOMATIC SELF-TEST MODE

BACKGROUND

This relates generally to wireless electronic devices and, more particularly, to testing of wireless electronic devices.

Wireless electronic devices typically include transceiver circuitry, antenna circuitry, and other radio-frequency circuitry that provide wireless communications capabilities. During testing, wireless electronic devices under test (DUTs) can exhibit different performance levels depending on whether each DUT has been properly manufactured. For example, each wireless DUT in a group of DUTs can exhibit its own frequency response, power efficiency, linearity, dynamic range, downlink sensitivity, etc.

The performance of a wireless DUT can be measured using a radio-frequency (RF) test station. A conventional radio-frequency test station includes a test host, a test unit (i.e., a signal generator), and a test cell. The test unit is wired to the test host. Connected in this way, the test host can configure the signal generator to transmit downlink radio-frequency signals during test operations.

In conventional radio-frequency test arrangements, a wireless DUT is placed into the test cell. The DUT is connected to the test host via a Universal Serial Bus (USB) cable (i.e., the DUT is "tethered" to the test host). A protocol-compliant connection is established between the test unit and the DUT (i.e., radio-frequency signals are conveyed between the test unit and the cellular telephone transceiver of the DUT using a desired radio access technology). The protocol-compliant connection may be formed via a wired path or a wireless path between the test unit and the DUT. Depending on test results gathered using the test unit, a test operator may determine whether the DUT satisfies design criteria.

Testing the radio-frequency performance of a wireless DUT in this way, however, may require the test operator to carefully place each DUT at a predetermined location within the test cell and may require path loss calibration. Because the path loss associated with the wired/wireless path between the test unit and the wireless DUT varies from station to station, reference DUTs sometimes referred to as "golden" reference units may be used to calibrate each station to ensure that test results gathered across the different stations can be compared. Test station path loss calibration performed using golden reference DUTs may be fairly time consuming.

Moreover, protocol-based testing requires more tedious measurement processes and also has a tendency to drop connections between the DUT and test unit when the output power falls below the DUT's downlink sensitivity. Re-establishing the protocol compliant connection in order to complete testing can add significant time and cost to the test process. The presence of the USB cable that is connected to the DUT can also degrade the accuracy of radio-frequency test measurements.

It would therefore be desirable to be able to provide improved ways of testing wireless electronic devices.

SUMMARY

An electronic device may include storage and processing circuitry and wireless communications circuitry. The storage and processing circuitry may include an applications processor and storage circuits, whereas wireless communications circuitry may include a baseband processor, transceiver circuitry, antennas, and other control circuitry. The electronic device may also contain peripheral device components such as a camera module, a display module, light-based sensors, audio components such as speakers and microphones, and other input-output devices. These peripheral components need not be turned on for proper wireless functionality of the electronic device.

The electronic device may be tested using a test station. The electronic device being tested may be referred to as a device under test (DUT). The test station may be used to determine which of the peripheral device components contribute excessive amounts of noise that can negatively impact antenna performance (e.g., the test station may be used to perform antenna desensitivity testing). The DUT may, for example, include at least one antenna operable to be used for receiving electromagnetic radio-frequency signals during testing.

The test station may include a radio-frequency shielded enclosure. The shielded enclosure may, for example, be a transverse electromagnetic cell. The DUT may be placed within the shielded enclosure during testing. Because all measurements will be made internally by the baseband processor of the DUT, the DUT may be placed in any location/orientation within the shielded enclosure.

The DUT may be configured to operate using automatic self test mode during antenna desensitivity testing. The DUT may be configured to automatically obtain baseline noise floor measurements while all the peripheral components are turned off at desired radio-frequency channels. The DUT may then automatically obtain elevated noise floor measurements while selectively activating different subsets of the peripheral components at the desired channels (e.g., the applications processor may place the DUT in respective states in which different combinations of peripheral components are switched into use).

The applications processor may then be used to compute the difference between the elevated noise floor measurements and the baseline noise floor measurements gathered across the different radio-frequency channels. If the computed difference is greater than a predetermined threshold, the associated peripheral component(s) may be marked as generating an excessive amount of noise. If the computed difference is less than the predetermined threshold, the associated peripheral component(s) may be marked as generating a tolerable amount of noise. The DUT may be reconfigured/reworked such that the problematic peripheral components desensitize the antenna by a lesser amount (by providing improved electrical isolation between the problematic peripheral components and the receiving antenna).

Further features of the present invention, its nature and various advantages will be more apparent from the accompanying drawings and the following detailed description.

DETAILED DESCRIPTION

Electronic devices may be provided with wireless communications circuitry. The wireless communications circuitry may be used to support wireless communications in multiple wireless communications bands. The wireless communications circuitry may include multiple antennas such as loop antennas, inverted-F antennas, strip antennas, planar inverted-F antennas, slot antennas, hybrid antennas that include antenna structures of more than one type, or other suitable antennas. Conductive structures for the antennas may be formed from conductive electronic device structures such as conductive housing structures (e.g., a ground plane and part of a peripheral conductive housing member or other housing structures), traces on substrates such as traces on plastic, glass, or ceramic substrates, traces on flexible printed circuit boards ("flex circuits"), traces on rigid printed circuit boards (e.g., fiberglass-filled epoxy boards), sections of patterned metal foil, wires, strips of conductor, other conductive structures, or conductive structures that are formed from a combination of these structures.

Figure 1:
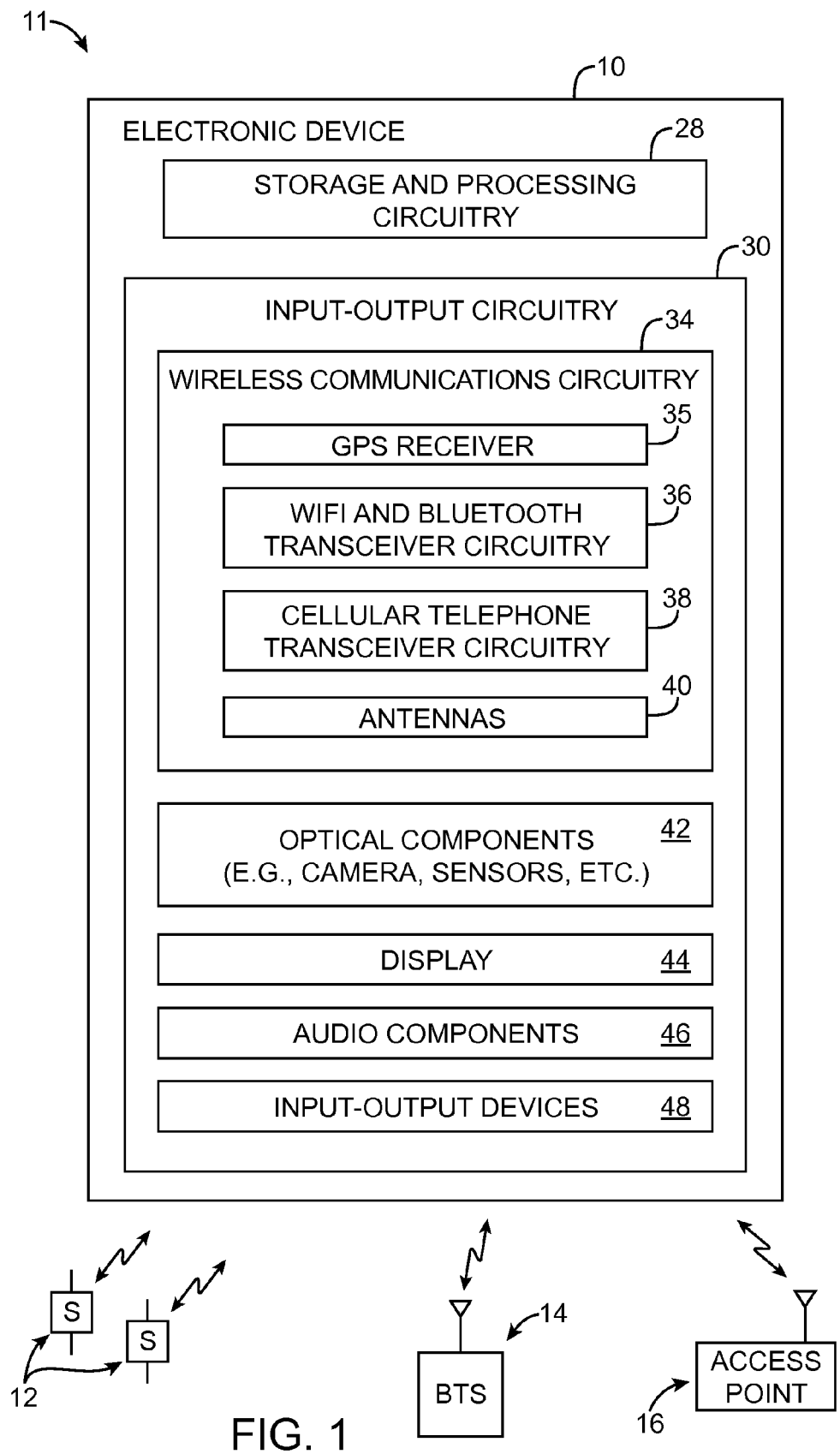
FIG. 1 is a schematic diagram of an illustrative wireless electronic device in accordance with an embodiment of the present invention.

A schematic diagram of a system in which electronic device 10 may operate is shown in FIG. 1. As shown in FIG. 1, system 11 may include wireless network equipment such as satellites 12, base station (or base transceiver station) 14, access point 16, and other wireless network devices. Satellites 12 may be Global Positioning System (GPS) satellites. Base station 14 may be associated with a cellular telephone network, whereas access point 16 may be associated with a wireless local area network (WLAN). Device 10 may communicate with these network devices over respective wireless communications links.

Device 10 may include control circuitry such as storage and processing circuitry 28. Storage and processing circuitry 28 may include storage such as hard disk drive storage, non-volatile memory (e.g., flash memory or other electrically-programmable-read-only memory configured to form a solid state drive), volatile memory (e.g., static or dynamic random-access-memory), etc. Processing circuitry in storage and processing circuitry 28 and other control circuits may be used to control the operation of device 10. This processing circuitry (sometimes referred to herein as an applications processor) may be based on one or more microprocessors, microcontrollers, digital signal processors, power management units, audio codec chips, application specific integrated circuits, etc.

Storage and processing circuitry 28 may be used to run software on device 10, such as internet browsing applications, voice-over-internet-protocol (VOIP) telephone call applications, email applications, media playback applications, operating system functions, etc. To support interactions with external equipment such as base station 14, storage and processing circuitry 28 may be used in implementing communications protocols. Communications protocols that may be implemented using storage and processing circuitry 28 include internet protocols, wireless local area network protocols (e.g., IEEE 802.11 protocols—sometimes referred to as WiFi®), protocols for other short-range wireless communications links such as the Bluetooth® protocol, IEEE 802.16 (WiMax) protocols, cellular telephone protocols such as the Long Term Evolution (LTE) protocol, Global System for Mobile Communications (GSM) protocol, Code Division Multiple Access (CDMA) protocol, Universal Mobile Telecommunications System (UMTS) protocol, etc.

Device 10 may include input-output (I/O) circuitry 30 that allows data to be conveyed between device 10 and external devices. Input-output circuit may include wireless communications circuitry 34. Circuitry 28 may be configured to implement control algorithms that control the use of antennas in circuitry 34. For example, circuitry 28 may configure wireless communications circuitry 34 to switch a particular antenna into use for transmitting and/or receiving signals or may switch multiple antennas into use simultaneously. In some scenarios, circuitry 28 may be used in gathering sensor signals and signals that reflect the quality of received signals (e.g., received paging signals, received voice call traffic, received control channel signals, received data traffic, etc.). This information may be used in controlling which antenna mode is used (e.g., single antenna mode or dual antenna mode) and may be used in selecting an optimum antenna in single antenna mode (if desired). Antenna selections can also be made based on other criteria.

An antenna switching algorithm that runs on the circuitry of device 10 can be used to automatically change between antenna modes in real time based on the evaluated signal quality of received signals. The antenna switching algorithm may direct device 10 to operate in a multiple antenna mode (e.g., a dual antenna mode) when incoming signals are weak and may direct device 10 to operate in a single antenna mode when incoming signals are strong (as an example). With this type of arrangement, it is not necessary to simultaneously use multiple antennas and associated receiver circuits for monitoring incoming paging signals except when paging signals are of poor quality, thereby minimizing power consumption.

Arrangements in which device 10 has a primary antenna (e.g., an antenna that typically exhibits superior performance) and a secondary antenna (e.g., an antenna whose performance typically does not exceed that of the primary antenna) are sometimes described herein as an example. This is, however, merely illustrative. Device 10 may use three or more antennas if desired. Device 10 may use antennas that are substantially identical (e.g., in band coverage, in efficiency, etc.), or may use other types of antenna configurations.

When operating in single antenna mode, either the primary or the secondary antenna may be used. For example, device 10 may default to use of the primary antenna whenever changing to single antenna mode from dual antenna mode while monitoring paging signals. If desired, device 10 may select an optimum antenna to use when transitioning from dual antenna mode to single antenna mode. Device 10 may select the optimum antenna by evaluating the signal strength on each antenna and choosing the antenna with the strongest signal or by using other suitable antenna selection criteria.

Wireless communications circuitry 34 may include radio-frequency (RF) transceiver circuitry formed from one or more integrated circuits, power amplifier circuitry, low-noise input amplifiers, passive RF components, one or more antennas, and other circuitry for handling RF wireless signals.

Wireless communications circuitry 34 may include satellite navigation system receiver circuitry such as Global Positioning System (GPS) receiver circuitry 35 (e.g., for receiving satellite positioning signals at 1745 MHz). Transceiver circuitry 36 may handle 2.4 GHz and 5 GHz bands for WiFi® (IEEE 802.11) communications and may handle the 2.4 GHz Bluetooth® communications band. Circuitry 34 may use cellular telephone transceiver circuitry 38 for handling wireless communications in cellular telephone bands such as bands at 700 MHz, 850 MHz, 900 MHz, 1800 MHz, 1900 MHz, and 2100 MHz or other cellular telephone bands of interest.

Wireless communications circuitry 34 can include circuitry for other short-range and long-range wireless links if desired (e.g., WiMax circuitry, etc.). Wireless communications circuitry 34 may, for example, include, wireless circuitry for receiving radio and television signals, paging circuits, etc. In WiFi® and Bluetooth® links and other short-range wireless links, wireless signals are typically used to convey data over tens or hundreds of feet. In cellular telephone links and other long-range links, wireless signals are typically used to convey data over thousands of feet or miles.

Wireless communications circuitry 34 may include antennas 40. Antennas 40 may be formed using any suitable types of antenna. For example, antennas 40 may include antennas with resonating elements that are formed from loop antenna structures, patch antenna structures, inverted-F antenna structures, closed and open slot antenna structures, planar inverted-F antenna structures, helical antenna structures, strip antennas, monopoles, dipoles, hybrids of these designs, etc. Different types of antennas may be used for different bands and combinations of bands. For example, one type of antenna may be used in forming a local wireless link antenna and another type of antenna may be used in forming a remote wireless link antenna. If desired, device 10 may include more than one cellular telephone antenna. For example, there may be one cellular telephone antenna in an upper region of device 10 and another cellular telephone antenna in a lower region of device 10. These antennas may be fixed or may be tunable.

Input-output circuitry 30 may also include optical components 42. Optical components 42 may include cameras, ambient light sensors, light-based proximity sensors, light-emitting diode status indicators, and other equipment for producing and receiving light.

Input-output circuitry 30 may also include one or more displays such as display 44. Display 44 may be a liquid crystal display, an organic light-emitting diode display, an electronic ink display, a plasma display, a display that uses other display technologies, or a display that uses any two or more of these display technologies. Display 44 may include an array of touch sensors (i.e., display 44 may be a touch screen) or may be insensitive to touch. The touch sensors in a touch sensitive arrangement for display 44 may be capacitive touch sensors formed from an array of transparent touch sensor electrodes such as indium tin oxide (ITO) electrodes or may be touch sensors formed using other touch technologies (e.g., acoustic touch, pressure-sensitive touch, resistive touch, optical touch, etc.).

Audio components 46 may be used to provide device 10 with audio input and output capabilities. Examples of audio components that may be included in device 10 include speakers, microphones, buzzers, tone generators, and other components for producing and detecting sound.

Device 10 may also include a battery, power management circuitry, accelerometers, and other sensors, and other input-output devices 48. Input-output devices 48 may include buttons, joysticks, click wheels, scrolling wheels, touch pads, key pads, keyboards, etc. A user can control the operation of device 10 by supplying commands through input-output circuitry 30 and may receive status information and other output from device 10 using the output resources of input-output circuitry 30.

Figure 2:
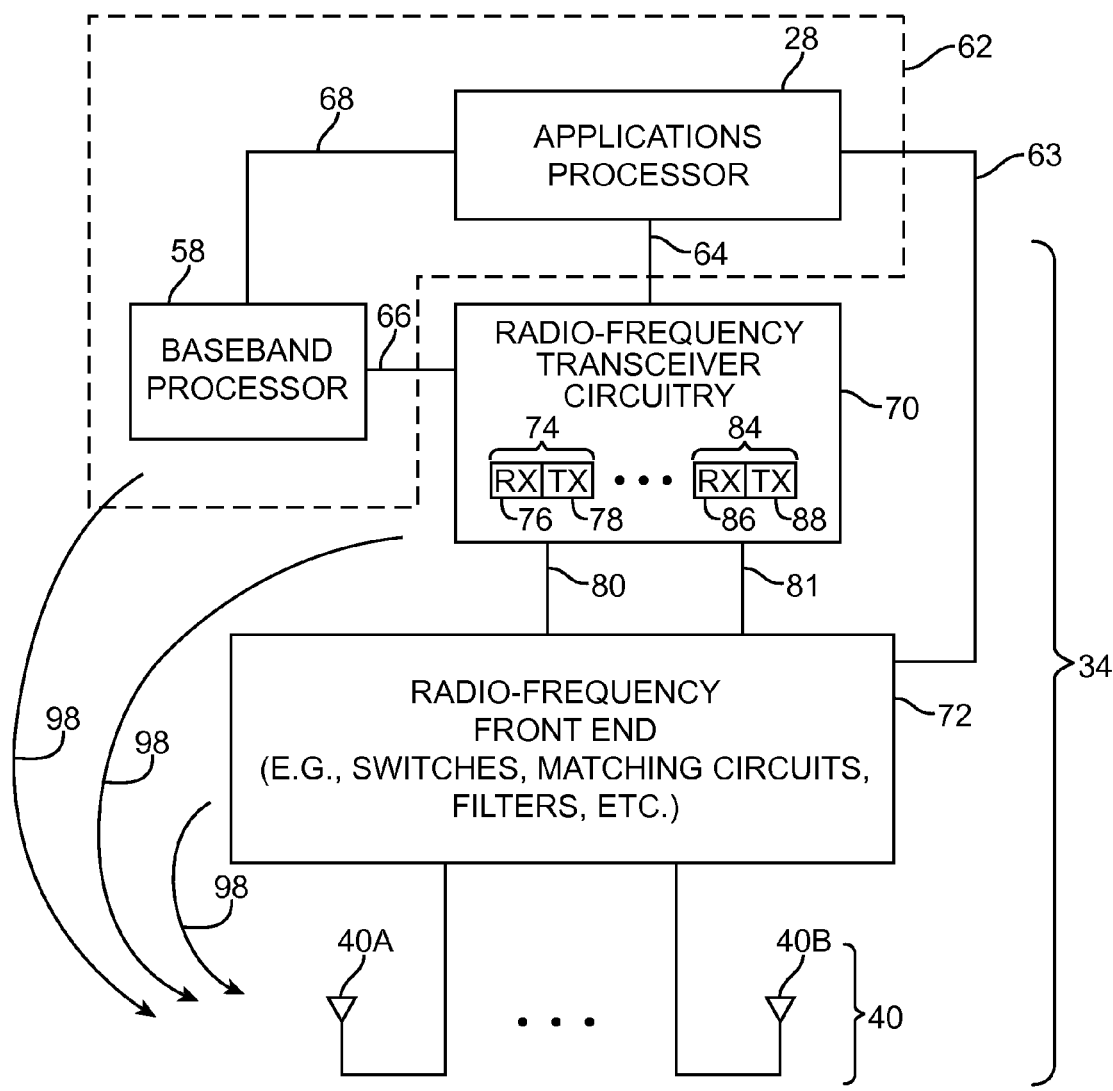
FIG. 2 is a diagram of illustrative wireless communications circuitry that may be used in an electronic device in accordance with an embodiment of the present invention.

Device 10 can be controlled by control circuitry that is configured to store and execute control code for implementing control algorithms (e.g., antenna diversity control algorithms and other wireless control algorithms). As shown in FIG. 2, control circuitry 62 may include applications processor 28 and may include baseband processor 58. Baseband processor 58 may form part of wireless circuitry 34 and may include memory and processing circuits (i.e., baseband processor 58 may be considered to form part of the applications processor).

Baseband processor 58 may provide data to applications processor 28 via path 68. The data on path 68 may include raw and processed data associated with wireless (antenna) performance metrics for received signals such as received power, transmitted power, frame error rate, bit error rate, channel quality measurements based on received signal strength indicator (RSSI) information, channel quality measurements based on received signal code power (RSCP) information, channel quality measurements based on signal-to-interference ratio (SINR) and signal-to-noise ratio (SNR) information, channel quality measurements based on signal quality data such as Ec/Io or Ec/No data, information on whether responses (acknowledgements) are being received from a cellular telephone tower corresponding to requests from the electronic device, information on whether a network access procedure has succeeded, information on how many re-transmissions are being requested over a cellular link between the electronic device and a cellular tower, information on whether a loss of signaling message has been received, information on whether paging signals have been successfully received, and other information that is reflective of the performance of wireless circuitry 34. This information may be analyzed by applications processor 28 and/or processor 58 and, in response, applications processor 28 (or, if desired, baseband processor 58) may issue control commands for controlling wireless circuitry 34. For example, applications processor 28 may issue control commands on paths 84 and 64.

Wireless circuitry 34 may include radio-frequency transceiver circuitry such as radio-frequency transceiver circuitry 70 and radio-frequency front-end circuitry 72. Radio-frequency transceiver circuitry 70 may include one or more radio-frequency transceivers such as transceivers 74 and 84 (e.g., one or more transceivers that are shared among antennas, one transceiver per antenna, etc.). In the illustrative configuration of FIG. 2, radio-frequency transceiver circuitry 70 has a first transceiver such as transceiver 74 that is associated with path (port) 80 and a second transceiver such as transceiver 84 that is associated with path (port) 81. Transceiver 74 may include a transmitter such as transmitter 78 and a receiver such as receiver 76 or may contain only a receiver (e.g., receiver 76) or only a transmitter (e.g., transmitter 78). Transceiver 84 may include a transmitter such as transmitter 88 and a receiver such as receiver 86 or may contain only a receiver (e.g., receiver 86) or only a transmitter (e.g., transmitter 78).

Baseband processor 58 may receive digital data that is to be transmitted from storage and processing circuitry 28 and may use path 66 and radio-frequency transceiver circuitry 70 to transmit corresponding radio-frequency signals. Radio-frequency front end 72 may be coupled between radio-frequency transceiver 70 and antennas 40 and may be used to convey the radio-frequency signals that are produced by transmitters 78 and 88 to antennas 40. Radio-frequency front end 72 may include radio-frequency switches, impedance matching circuits, filters, and other circuitry for forming an interface between antennas 40 and radio-frequency transceiver 70.

Incoming radio-frequency signals that are received by antennas 40 may be provided to baseband processor 58 via radio-frequency front end 72, paths such as paths 80 and 81, and receiver circuitry in radio-frequency transceiver 70 such as receiver 76 at port 80 and receiver 86 at port 81. Baseband processor 58 may convert these received signals into digital data that is provided to applications processor 28. Baseband processor 58 may also extract information from received signals that is indicative of signal quality for the channel to which the transceiver is currently tuned. For example, baseband processor and/or other circuitry in control circuitry 62 may analyze received signals to produce bit error rate measurements, measurements on the amount of power associated with incoming wireless signals, strength indicator (RSSI) information, received signal code power (RSCP) information, signal-to-interference ratio (SINR) information, signal-to-noise ratio (SNR) information, channel quality measurements based on signal quality data such as Ec/Io or Ec/No data, etc.

Radio-frequency front end 62 may include a switch that is used to connect transceiver 74 to antenna 40B and transceiver 84 to antenna 40A or vice versa. The switch may be configured by control signals received from control circuitry 62 over path 63. Circuitry 62 may, for example, adjust the switch to select which antenna is being used to transmit radio-frequency signals (e.g., when it is desired to share a single transmitter in transceiver 70 between two antennas) or which antenna is being used to receive radio-frequency signals (e.g., when it is desired to share a single receiver between two antennas).

If desired, antenna selection may be made by selectively activating and deactivating transceivers without using a switch in front end 72. For example, if it is desired to use antenna 40A but not antenna 40B, transceiver (which may be coupled to antenna 40A through circuitry 72) may be activated and transceiver 84 (which may be coupled to antenna 40B through circuitry 72) may be deactivated. If it is desired to use antenna 40B but not antenna 40A, circuitry 62 may activate transceiver 84 and deactivate transceiver 74. Combinations of these approaches may also be used to select which antennas are being used to transmit and/or receive signals. When it is desired to receive incoming signals such as paging signals using both antennas, transceiver 74 and transceiver 84 may be simultaneously activated to place device 10 in a dual antenna mode.

Control operations such as operations associated with configuring wireless circuitry 34 to transmit or receive radio-frequency signals through desired antennas 40 may be performed using a control algorithm that is implemented on control circuitry 62 (e.g., using the control circuitry and memory resources of applications processor 28 and baseband processor 58).

In general, it may be desirable to be able to characterize the performance of wireless communications circuitry 34. In particular, it may be desirable to determine whether components other than wireless communications circuitry 34 and circuitry 28 on device 10 will negatively impact antenna performance. The components other than circuitry 34 and 28 may include optical components 42, display module 44, audio components 46 and other input-output devices 48 that are part of device 10 and may be referred to collectively as "peripheral" components (i.e., components that need not be turned on for proper wireless transmit/receive functionality of device 10).

For example, all peripheral components may be turned off during testing. Even if all the peripheral components are disabled, applications processor 28, baseband processor 58, transceiver circuitry 70, radio-frequency front-end 72, and other active wireless communications circuitry will generate electromagnetic noise, which may couple onto antenna 40A (as indicated by arrows 98 in the example of FIG. 2). In this example, antenna 40A may be placed in receive mode but may not be transmitting any radio-frequency signals, and antenna 40B may be switched out of use. The antenna that is switched into use during testing may be referred to as the current antenna under test.

Noise signals received using antenna 40A may be analyzed using baseband processor 58. Baseband processor 58 may be configured to extract corresponding test data indicative of the signal quality of the noise signals currently being received by antenna 40A. Examples of signal quality measurements that may be made in device 10 include bit error rate measurements, signal-to-noise ratio measurements, measurements on the amount of power associated with incoming wireless signals, channel quality measurements based on received signal strength indicator (RSSI) information (RSSI measurements), channel quality measurements based on received signal code power (RSCP) information (RSCP measurements), channel quality measurements based on signal-to-interference ratio (SINR) and signal-to-noise ratio (SNR) information (SINR and SNR measurements), channel quality measurements based on signal quality data such as Ec/Io or Ec/No data (Ec/Io and Ec/No measurements), etc. Test measurements obtained while all the peripheral components are turned off may be referred to as "baseline" noise floor measurements.

Activating at least one of the peripheral components may potentially degrade antenna performance. For example, consider a scenario in which camera module 42 is turned on during testing. Camera module 42 may generate additional noise which may couple onto antenna 40A. As a result, test measurements obtain while camera module 42 is turned on may be higher than the baseline noise floor measurements and may therefore sometimes be referred to as "elevated" noise floor measurements. Applications processor 28 may be used to compute the difference between the elevated and baseline noise floor measurements (referred to herein as $\Delta P$). If the magnitude of $\Delta P$ is less than a predetermined threshold, the impact that the noise generated by camera module 42 has on wireless communications circuitry 34 may be considered tolerable. If the magnitude of $\Delta P$ exceeds the predetermined threshold, camera module 42 may be considered to be generating an unacceptable amount of noise (e.g., camera module 42 may be considered to be sufficiently "desensitizing" antenna 40A). In such scenarios, device 10 may be reconfigured (e.g., additional shielding material may be interposed between camera module 42 and wireless circuitry 34, camera module 42 may be repositioned further away from wireless circuitry 34, etc.) such that the amount of noise being coupled from camera module 42 to antenna 40A is reduced to satisfactory levels.

This example in which the performance of antenna 40A is being tested is merely illustrative and does not serve to limit the scope of the present invention. If desired, the performance of antenna 40B may be tested while antenna 40A is switched out of use. In general, desensitivity testing may be performed on any one antenna that is part of antenna structures 40 (e.g., by measuring the baseline noise floor while all the peripheral components are turned off, by measuring an elevated noise floor while a selected one of the peripheral components is activated, and by computing the difference between the elevated noise floor and the baseline noise floor). If desired, any selected subset of the peripheral components may be turned on when performing antenna desensitivity testing (e.g., any combination of the peripheral components of device 10 may be activated when gathering elevated noise floor measurements).

Figure 3:
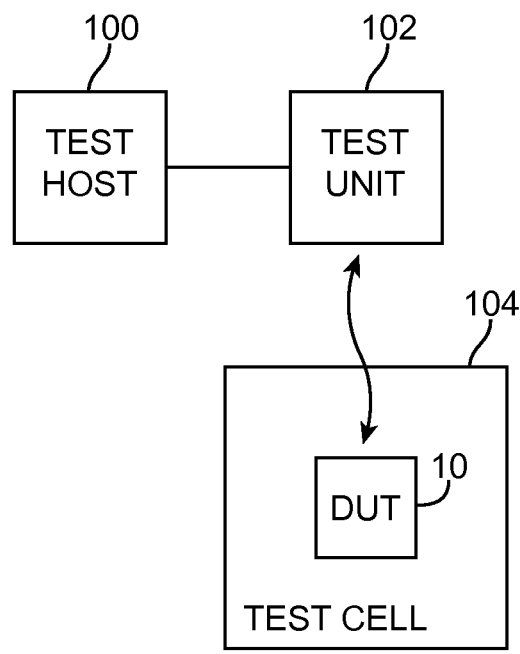
FIG. 3 is a diagram of a conventional test station.

FIG. 3 is a diagram of a conventional test station for testing device 10. An electronic device being tested using a test station is sometimes referred to as a device under test (DUT). The conventional test station includes a test host 100, a test unit 102 (i.e., a vector network analyzer), and a test cell 104 (i.e., a transverse electromagnetic cell).

During test operations, a test operator places DUT 10 within test cell 104. The position and orientation of DUT 10 that is secured within test cell 104 needs to be precise in order to ensure that test results gathered from different DUTs using that particular test station is comparable. Any human error arising from carelessness in the actions of the test operator can unintentionally skew test results. DUT 10 can communicate with test unit 102 via a wired path (i.e., via a coaxial cable) or a wireless path (i.e., radio-frequency test signals may be transmitted over-the-air).

Testing a DUT 10 using the conventional test station may be costly because test units 102 are expensive. Moreover, path loss between test unit 102 and DUT 10 in each test station needs to be calibrated prior to testing to take into account path loss variation among the different test stations. Path loss calibration procedures require the use of reference units (golden reference DUTs) and may be time consuming. Initiating and maintaining an active communications link between test unit 102 and DUT 10 may also be tedious and can add significant time and cost to the test process.

Figure 4:
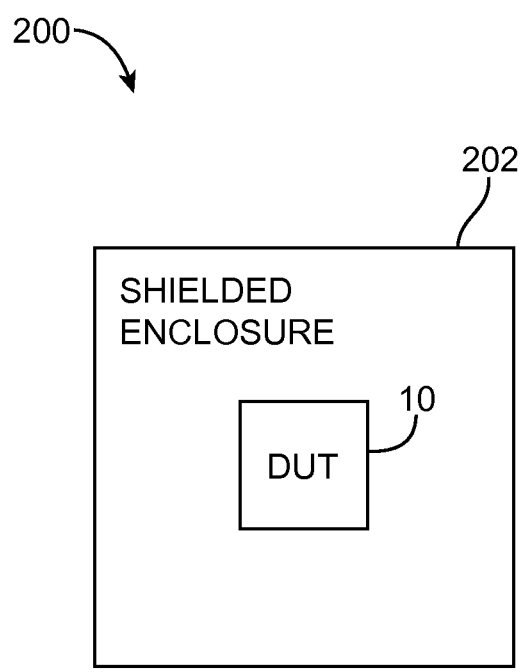
FIG. 4 is a diagram of an illustrative test station that may be used to test a wireless electronic device configurable to operate in self-test mode in accordance with an embodiment of the present invention.

FIG. 4 is a diagram of an illustrative test station 200 having only a shielded enclosure 202. Shielded enclosure 202 (e.g., a shielded test box) may be used to provide radio-frequency isolation when performing electromagnetic compatibility (EMC) radiated tests without experiencing interference from outside environment. Test enclosure 202 may, for example, be a transverse electromagnetic (TEM) cell. The interior of test enclosure 202 may be lined with radio-frequency absorption material such as rubberized foam configured to minimize reflections of wireless signals. Shielded enclosure 202 of this type need not include any radio-frequency coupling circuits or test antennas. Test station 200 may be used to perform antenna desensitivity testing on DUT 10 without requiring the use of test hosts, test units, radio-frequency cabling, path loss calibration, golden reference units, etc.

DUT 10 may be configured to operate in automatic self test mode. DUT 10 may be loaded with a test operating system (e.g., a simplified operating system that lacks a full Internet Protocol (IP) stack implementation) or a normal user operating system (e.g., an operating system that includes a full Internet Protocol (IP) stack implementation). While DUT 10 is placed within enclosure 202, DUT 10 may be configured to measure baseline noise floor measurements at desired frequencies, may be configured to measure elevated noise floor measurements by selectively activating desired subsets of the peripheral device components at the desired frequencies, may be configured to compute $\Delta P$ values corresponding to the different frequencies, etc.

Figure 5:
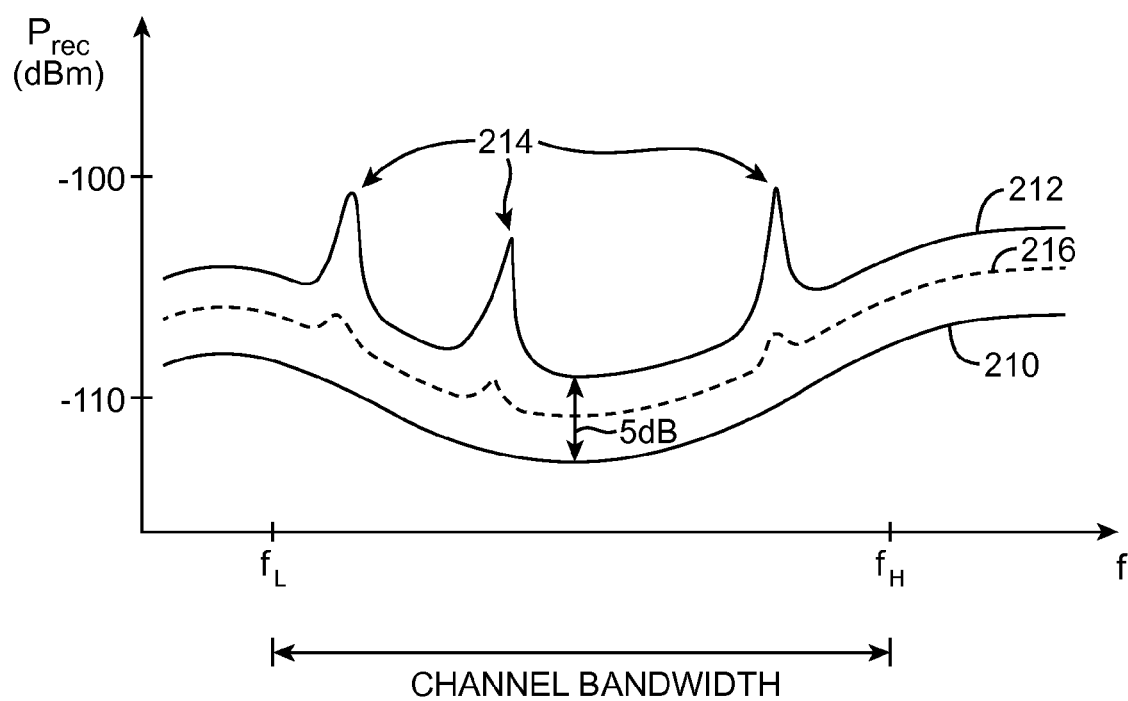
FIG. 5 is a plot of receive power level versus frequency showing different noise floor measurements associated with a wireless electronic device operating in different states in accordance with an embodiment of the present invention.

FIG. 5 is an exemplary plot of received signal power level Prec versus frequency. Curve 210 may represent a baseline noise floor measured at a selected radio-frequency channel (e.g., from $f_L$ to $f_H$). Curve 212 may, for example, represent an elevated noise floor when a peripheral device component such as display module 44 is turned on. Curve 212 may also exhibit spurs such as spurs 114 having elevated power levels capable of causing undesired radio-frequency artifacts in the selected RF channel. As shown in FIG. 5, the difference $\Delta P$ between curve 210 and 212 may be at least 5 dB. A $\Delta P$ of 5 dB may not meet design criteria (e.g., $\Delta P$ may exceed a predetermined threshold value). In such scenarios, DUT 10 may be sent for rework so that the electromagnetic insulation between display module 44 and the current antenna under test is enhanced. Curve 216 may, as an example, represent a corrected noise floor for DUT 10 that has undergone rework.

Difference $\Delta P$ between curves 216 and 210 may be satisfactory (e.g., if the corrected $\Delta P$ is less than the predetermined threshold).

The noise floor measurements based on receive power level as shown in FIG. 5 are merely illustrative. If desired, the noise floor measurements computed using baseband processor 58 of DUT 10 may be based on radio-frequency downlink metrics such as bit error rate measurements, signal-to-noise ratio measurements, measurements on the amount of power associated with incoming wireless signals, channel quality measurements based on received signal strength indicator (RSSI) information, channel quality measurements based on received signal code power (RSCP) information, channel quality measurements based on signal-to-interference ratio (SINR) and signal-to-noise ratio (SNR) information, channel quality measurements based on signal quality data such as Ec/Io or Ec/No data, etc.

Figure 6:
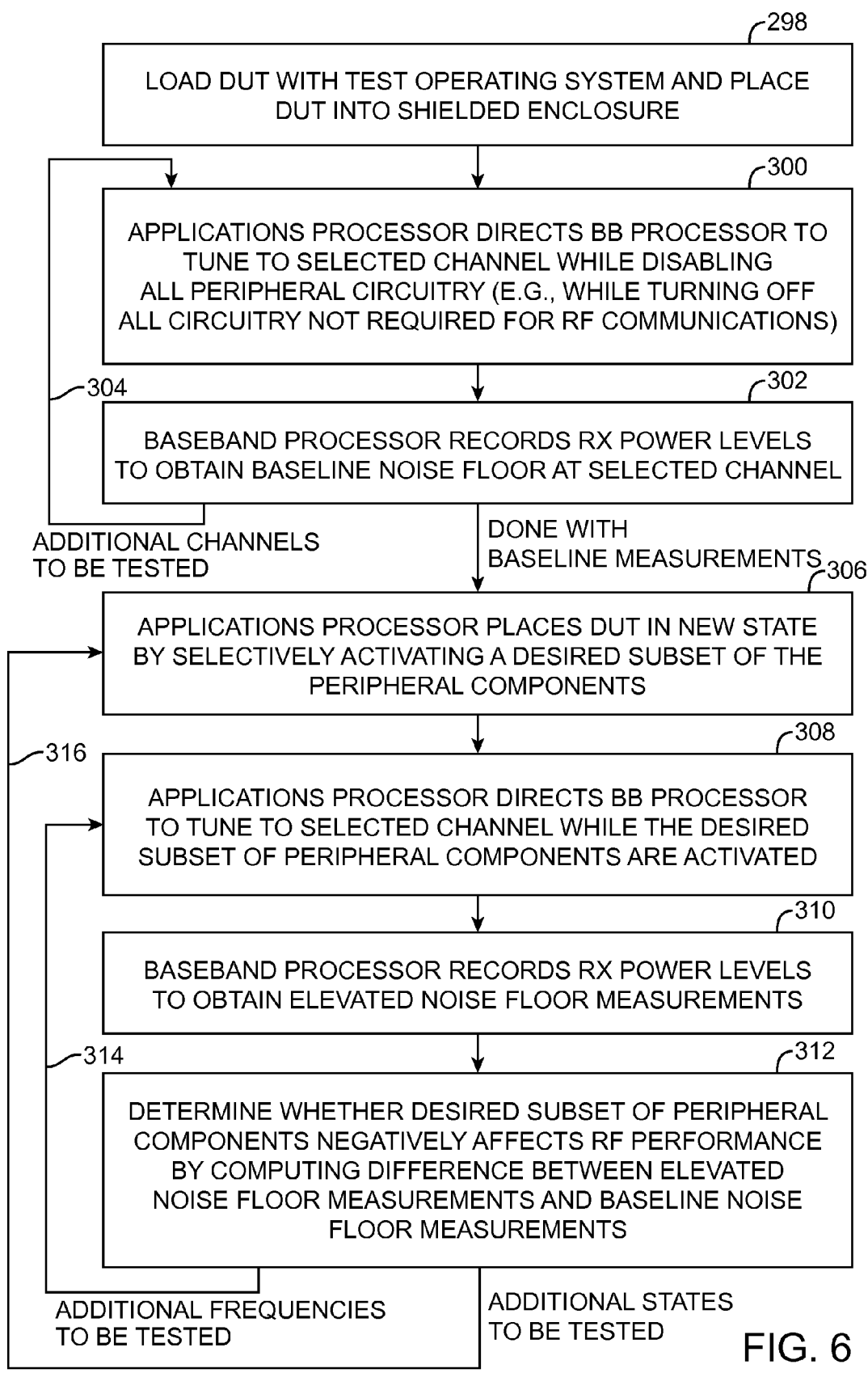
FIGS. 6 and 7 are flow charts of illustrative steps involved in testing a wireless electronic device operating in self-test mode in accordance with an embodiment of the present invention.

FIG. 6 shows illustrative steps involved in operating DUT 10 in self test mode. At step 298, DUT 10 may be loaded with the test operating system (e.g., applications processor 28 may run based on an automatic self test algorithm) and may be placed into shielded enclosure 202. At step 300, applications processor 28 may direct baseband processor 58 to tune to a selected radio-frequency channel while disabling all peripheral circuitry. At step 302, a current antenna under test may receive electromagnetic noise signals generated within enclosure 202, and baseband processor 58 may be used to obtain a baseline noise floor measurement for the selected channel. Processing may loop back to step 300 to gather baseline noise floor measurements for other desired radio-frequency channels, as indicated by path 304.

Once sufficient baseline noise floor measurements have been gathered, testing may proceed to step 306. At step 306, applications processor 28 may place DUT 10 in a new state by selectively activating a desired subset of the peripheral components (e.g., applications processor 28 may turn on at least one peripheral input-output component, at least two peripheral input-output components, at least three peripheral input-output components, etc.). At step 308, applications processor 28 may direct baseband processor 58 to tune to a selected channel while the desired subset of the peripheral components is activated.

At step 310, the current antenna under test may receive electromagnetic noise signals generated within enclosure 202, and baseband processor 58 may be used to obtain an elevated noise floor measurement for the selected channel (i.e., a noise floor measurement that includes the baseline noise and the additional noise generated by the activated subset of peripheral components).

At step 312, applications processor 28 may then compute difference $\Delta P$ between the elevated noise floor measurement and the corresponding baseline noise floor measurement associated with the selected channel. The magnitude of $\Delta P$ may be indicative of whether the activated subset of peripheral components degrades the performance of the current antenna under test by an excessive amount. Processing may loop back to step 308 to obtain additional elevated noise floor measurements at other channels, as indicated by path 314. Processing may loop back to step 306 to test additional states (e.g., by activating another subset of peripheral components), as indicated by path 316. Testing multiple device states (configurations) may provide information reflective of which device components are most detrimental to the wireless performance of DUT 10. This type of antenna desense information may be useful during the design verification phase and also during the production test phase.

Once all desired states have been tested, DUT 10 may be removed from shielded enclosure 202 (step 320). At step 322, DUT 10 may then be plugged into a test host (e.g., a personal computer) so that test data can be retrieved. At step 324, the test host may be used to identify whether at least some of the peripheral components degrade antenna performance by an excessive amount (e.g., by comparing the respective ΔP values to a predetermined threshold value). At step 326, DUT 10 may be configured to provide more radio-frequency isolation between the current antenna under test and the identified peripheral components (e.g., DUT 10 may be sent for rework or may be redesigned using different circuit arrangements/implementations). At this point, processing may loop back to step 298 to retest DUT 10 to check whether any preexisting issues have been corrected.

Figure 7:
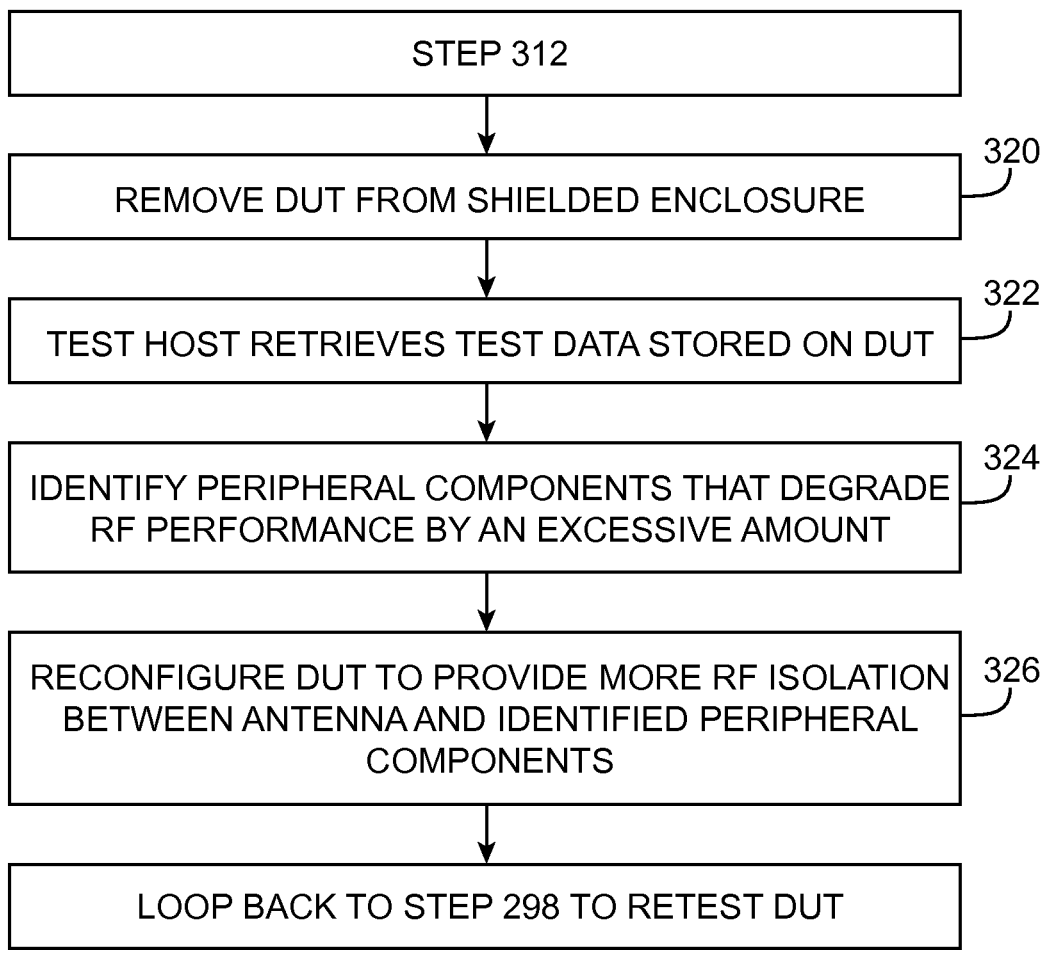

The steps described in connection with FIGS. 6 and 7 are merely illustrative and do not serve to limit the scope of the present invention. If desired, DUT 10 may subsequently be tested using the conventional test station of FIG. 3 to test ability of wireless circuitry 34 to establish and maintain a protocol-compliant connection in an over-the-air radiated test setup or a conducted test setup (as examples).

The foregoing is merely illustrative of the principles of this invention and various modifications can be made by those skilled in the art without departing from the scope and spirit of the invention. The foregoing embodiments may be implemented individually or in any combination.

What is claimed is:

1. A method for testing an electronic device under test that contains wireless communications circuitry and peripheral input-output devices, the method comprising:
    while each of the peripheral input-output devices is turned off, using the wireless communications circuitry to obtain a first radio-frequency power level measurement at a selected frequency channel and a first radio frequency power level measurement at an additional frequency channel;
    after the wireless communications circuitry has obtained the first radio frequency power level measurement at the selected frequency channel and the first radio frequency power level measurement at the additional frequency channel, while at least one of the peripheral input-output devices is turned on, using the wireless communications circuitry to obtain a second radio frequency power level measurement at the selected frequency channel; and
    characterizing radio-frequency performance of the electronic device under test based on the first and second radio frequency power level measurements at the selected channel.

2. The method defined in claim 1 wherein the electronic device under test further contains an applications processor, the method further comprising:
    with the applications processor, computing a difference between the first radio frequency power level measurement at the selected frequency channel and the second radio frequency power level measurement at the selected frequency channel.

3. The method defined in claim 2 further comprising:
    in response to determining that the difference is less a predetermined threshold, marking the peripheral input-output device as producing an acceptable amount of noise; and
    in response to determining that the difference exceeds the predetermined threshold, marking the peripheral input-output device as producing an excessive amount of noise.

4. The method defined in claim 2 wherein the wireless communications circuitry includes a baseband processor and wherein using the wireless communications circuitry to obtain the first radio frequency power level measurement at the selected frequency channel and the second radio frequency power level measurement at the selected frequency channel comprises making the first radio frequency power level measurement at the selected frequency channel and the second radio frequency power level measurement at the selected frequency channel with the baseband processor.

5. The method defined in claim 1 wherein the wireless communications circuitry includes a baseband processor and wherein using the wireless communications circuitry to obtain the first radio frequency power level measurement at the selected frequency channel and the second radio frequency power level measurement at the selected frequency channel comprises making the first radio frequency power level measurement at the selected frequency channel and the second radio frequency power level measurement at the selected frequency channel with the baseband processor.

6. The method defined in claim 1 wherein the wireless communications circuitry includes at least one antenna, the method further comprising:
    with the antenna, receiving only noise signals generated from the wireless communications circuitry when obtaining the first radio frequency power level measurement at the selected frequency channel; and
    with the antenna, receiving only noise signals generated from the wireless communications circuitry and the at least one of the peripheral input-output devices when obtaining the second radio frequency power level measurement at the selected frequency channel.

7. The method defined in claim 1 wherein the peripheral input-output devices comprise devices selected from the group consisting of: cameras, light-based sensors, displays, touch-based sensors, audio devices, and accelerometers.

8. The method define claim 1 further comprising:
    after using the wireless communications circuitry to obtain a second radio frequency power level measurement at the selected frequency channel, using the wireless communications circuitry to obtain a second radio frequency power level measurement at the additional frequency channel.

9. A method for testing an electronic device under test using a test station, wherein the test station includes a test enclosure in which the electronic device under test is tested and wherein the electronic device under test contains processing circuitry and wireless communications circuitry, the method comprising:
    using an antenna in the wireless communications circuitry to receive noise signals generated by the wireless communications circuitry and the processing circuitry, wherein the antenna does not receive radio-frequency signals generated by the test station;
    with the wireless communications circuitry, making radio frequency power level measurements on the received noise signals, wherein the electronic device under test further contains peripheral input-output devices, and wherein making the radio-frequency power level measurements on the received noise signals comprises:
        making a first radio frequency power level measurement in a selected frequency channel while the peripheral input-output devices are turned off;
        after making the first radio frequency power level measurement in the selected frequency channel, making a first radio frequency power level measurement in an additional frequency channel while the peripheral input-output devices are turned off;

after making the first radio frequency power level measurement in the additional frequency channel, making a second radio frequency power level measurement in the selected frequency channel while a subset of the peripheral input-output devices is turned on; and after making the second radio frequency power level measurement in the selected frequency channel, making a second radio frequency power level measurement in a additional frequency channel while the subset of the peripheral input-output devices is turned on; and characterizing radio-frequency performance of the electronic device under test based on the first radio frequency power level measurements in the selected and additional frequency channels and the second radio frequency power level measurements in the selected and additional frequency channels.

10. The method defined in claim 9 further comprising:
configuring the antenna to prevent transmission of radio-frequency signals.

11. The method defined in claim 9 wherein the wireless communications circuitry contains a baseband processor, the method further comprising:
with the baseband processor, making the radio-frequency power level measurements on the received noise signals.

12. The method defined in claim 9 further comprising:
with the processing circuitry, computing a difference between the first and second radio frequency power level measurements in the selected frequency channel.

13. The method defined in claim 12 further comprising:
in response to determining that the difference is less a predetermined threshold, marking the subset of peripheral input-output devices as producing an acceptable amount of noise; and
in response to determining that the difference exceeds the predetermined threshold, marking the subset of peripheral input-output devices as producing an excessive amount of noise.

14. The method defined in claim 9 wherein the peripheral input-output devices comprise devices selected from the group consisting of: cameras, light-based sensors, displays, touch-based sensors, audio devices, and accelerometers.

15. A method for testing an electronic device under test that contains wireless communications circuitry, the method comprising:
configuring the electronic device under test to operate in a self test mode so that the electronic device under test will automatically be placed in different states; and
while the electronic device is operating in each of the different states, obtaining first radio-frequency power level measurements with the wireless communications circuitry, wherein the electronic device under test further contains peripheral input-output devices, wherein configuring the electronic device under test in the self test mode comprises configuring the electronic device under test to selectively activate respective subsets of the peripheral input-output devices in each of the different states, and wherein the peripheral input-output devices comprise devices selected from the group consisting of: cameras and light-based sensors; and
characterizing radio-frequency performance of the electronic device under test based on the first radio-frequency power level measurements.

16. The method defined in claim 15 wherein the peripheral input-output devices further comprise devices selected from the group consisting of: displays, touch-based sensors, audio devices, and accelerometers.

17. The method defined in claim 15 further comprising:
with the wireless communications circuitry, obtaining second radio-frequency power level measurements while each of the peripheral input-output devices is turned off.

18. The method defined in claim 17 wherein the electronic device under test further comprises an applications processor, the method further comprising:
with the applications processor, comparing the first and second radio-frequency power level measurements to determine whether the wireless communications circuitry is performing satisfactorily in each of the different states.

\* \* \* \* \*